(12) United States Patent
Ito

(10) Patent No.: US 7,271,478 B2
(45) Date of Patent: Sep. 18, 2007

(54) PRINTED CIRCUIT BOARD AND INKJET HEAD

(75) Inventor: Koji Ito, Gifu (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 330 days.

(21) Appl. No.: 11/012,497

(22) Filed: Dec. 16, 2004

(65) Prior Publication Data

US 2005/0133898 A1 Jun. 23, 2005

(30) Foreign Application Priority Data

Dec. 22, 2003 (JP) ............................. 2003-424044

(51) Int. Cl.
*H01L 23/02* (2006.01)

(52) U.S. Cl. ...................... 257/686; 257/737

(58) Field of Classification Search ................ 257/686, 257/737, 738

See application file for complete search history.

(56) References Cited

U.S. PATENT DOCUMENTS 4,411,719 A 10/1983 Lindberg
5,061,988 A 10/1991 Rector
2002/0097299 A1 7/2002 Terui
2003/0128326 A1 7/2003 Yamaguchi et al.

FOREIGN PATENT DOCUMENTS

| JP | A 57-117265 | 7/1982 |
| JP | 2 344 463 A | 6/2000 |
| JP | A 2002-353273 | 12/2002 |

*Primary Examiner*—Roy Potter
(74) *Attorney, Agent, or Firm*—Oliff & Berridge, PLC.

(57) ABSTRACT

A printed circuit board is provided with first lands, second lands, and third lands. The first lands are arranged so as to correspond to first bumps arranged along a first side of an integrated circuit device when the integrated circuit device is mounted on the printed circuit board. The first lands are used to output electrical signals individually. The second lands are less in number than the first lands, and arranged so as to correspond to second bumps arranged along a second side of the integrated circuit device opposite to the first side. The second lands have an area the same as that of the first lands, and are used to input electrical signals individually. The third lands are arranged so as to correspond to third bumps arranged in a row formed by the second bumps, have an area larger than that of the first lands, and are not used to input or output electrical signals.

20 Claims, 9 Drawing Sheets

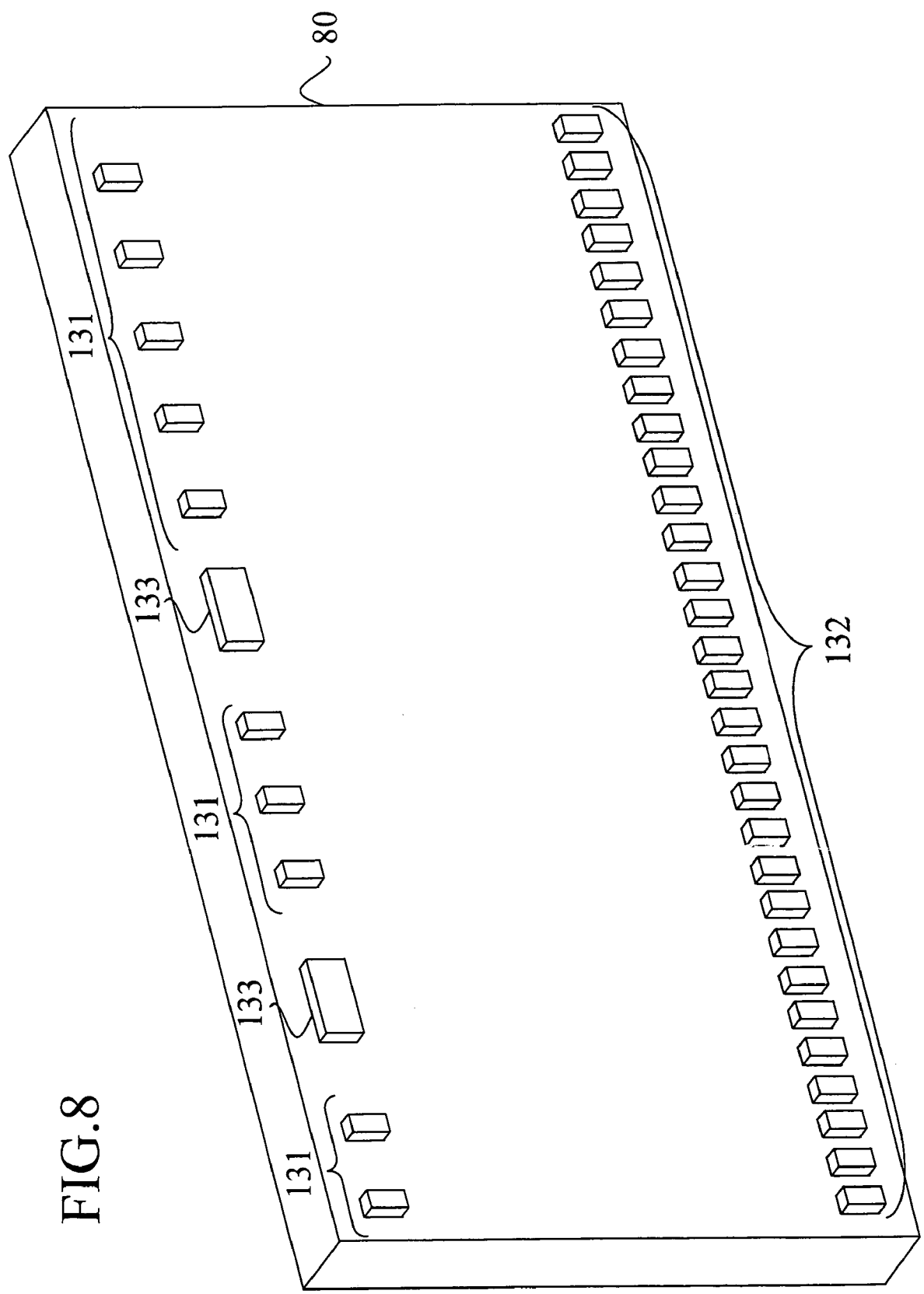

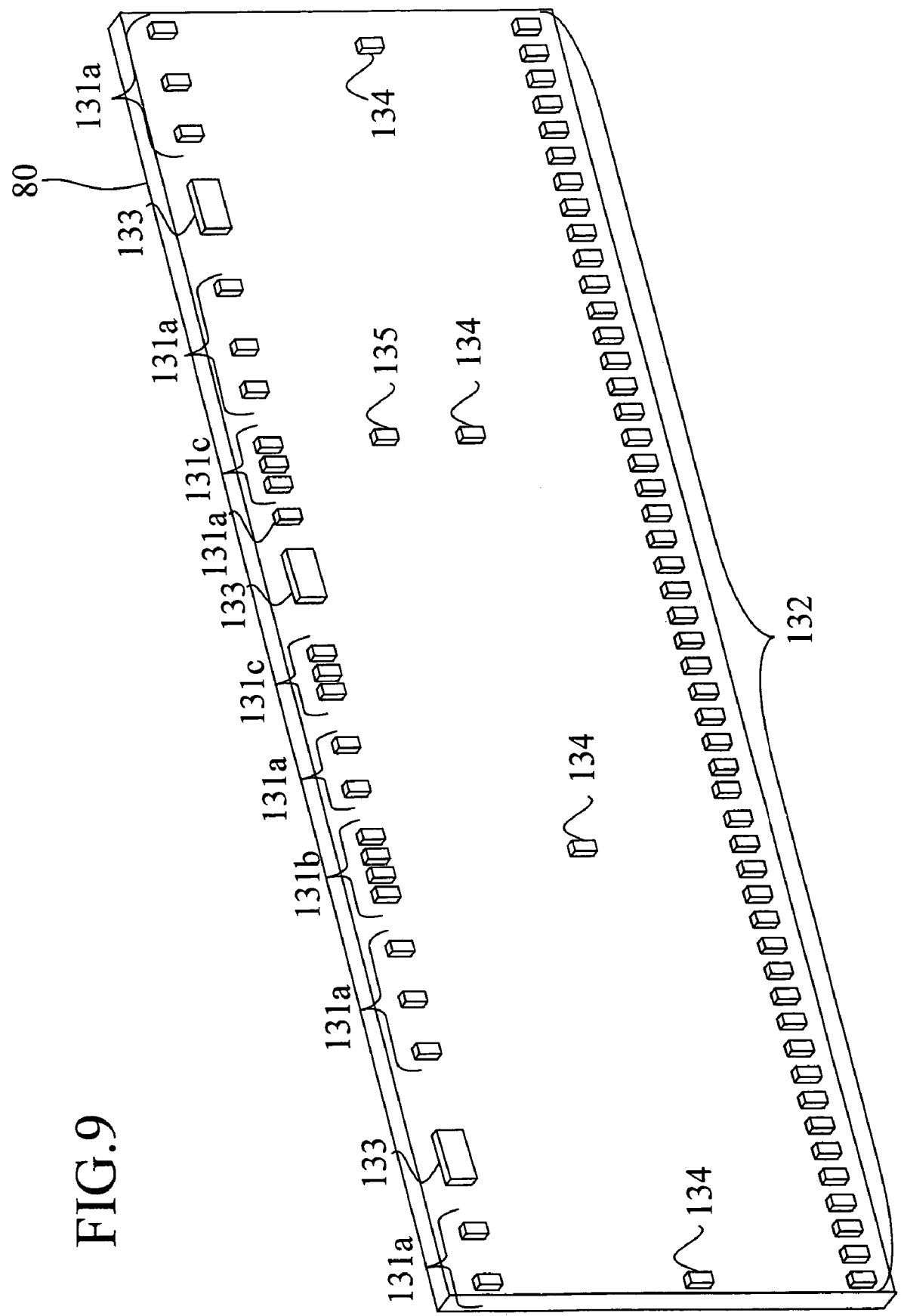

PRINTED CIRCUIT BOARD AND INKJET HEAD

This application claims priority from JP 2003-424044, filed Dec. 22, 2003, the entire disclosure of which is incorporated herein by reference thereto.

BACKGROUND

The disclosure relates to a printed circuit board on which devices of integrated circuits are mounted and an inkjet head employing such a printed circuit board.

Miniaturization of semiconductor devices has been desired as a result of the demands for the miniaturization of electronic equipment. Semiconductor devices are surface-mounted to printed circuit boards. Further, bare chips having no packages, such as ceramics, are directly mounted on printed circuit boards. This is called bare chip mounting. The bare chip mounting is a technology in which bumps, which are protruding electrodes disposed on lower surfaces of the bare chips and formed by, for example, gold, are bonded to lands, which are flat-surface electrodes formed on the printed circuit boards, by high temperature and high pressure, so that the bare chips are mounted on the printed circuit boards. Bumps of bare chips and corresponding lands are minute having a width of about 30 µm. In bare chip mounting, precise positioning and precise measurement of the pressure to be applied are required.

SUMMARY

Some bare chips are structured such that the bumps are arranged near each side of the bare chips and the number of bumps arranged near one side is greatly different as compared with the number of bumps arranged near the side opposite to it. For example, for a bare chip having an input portion of serial signals and an output portion of parallel signals disposed opposite to each other, in general the number of bumps on the input portion side is less than the number of bumps on the output portion side. When such a bare chip is mounted on a printed circuit board, the sum of areas where the bumps are bonded to the lands becomes smaller at the input portion side than at the output portion side, and entire bonding strength on the input portion side is relatively weak. Thus, if external forces are applied to the mounted bare chip, some bumps and lands at the input portion side may be disconnected. In particular, a printed circuit board having high flexibility is liable to sustain stress at the joints of bumps and lands even when it is bent slightly, so that the bumps and the lands at the input portion side are liable to be disconnected. Accordingly, the bare chip described above has a reliability problem when mounted to the printed circuit board.

Described herein is a printed circuit board capable of increasing reliability to mount a bare chip thereon even if the number of bumps is different on sides opposite to each other, and an inkjet head for use with such a printed circuit board.

According to one aspect, a printed circuit board includes a plurality of first lands, a first wiring pattern, a plurality of second lands, a second wiring pattern, and an at least one third land. The plurality of first lands are arranged to correspond to a plurality of first bumps, on an integrated circuit device having a first side and a second side opposite each other, when the integrated circuit device is mounted on the printed circuit board. The plurality of first bumps are arranged along the first side of the integrated circuit device. The plurality of first lands is used for individually inputting or outputting an electrical signal with respect to the integrated circuit device via the plurality of first bumps when the integrated circuit device is mounted on the printed circuit board. The first wiring pattern is connected to the plurality of first lands. The plurality of second lands are arranged to correspond to a plurality of second bumps arranged along the second side of the integrated circuit device when the integrated circuit device is mounted on the printed circuit board. The plurality of second lands is less than the plurality of first lands in number. The plurality of second lands is used for individually inputting or outputting an electrical signal with respect to the integrated circuit device via the plurality of second bumps when the integrated circuit device is mounted on the printed circuit board. The second wiring pattern is connected to the plurality of second lands. The at least one third land is disposed to correspond to an at least one third bump disposed closer to a row formed by the plurality of second bumps than a row formed by the plurality of first bumps on the integrated circuit device when the integrated circuit device is mounted on the printed circuit board. The at least one third land has an area larger than each one of the plurality of first lands. The at least one third land is not used for inputting and outputting the electrical signal with respect to the integrated circuit device via the at least one third bump when the integrated circuit device is mounted on the printed circuit board. In context, the phrase "disposed close to", used to describe a position relationship can include "disposed in". The meaning is the third bump, or bumps, is positioned toward or on the side of the second bumps, not the side of the first bumps.

The integrated circuit device is a rectangle. The plurality of first lands may be arranged substantially linearly so as to correspond to the plurality of first bumps arranged substantially linearly along the first side of the integrated circuit device when the integrated circuit device is mounted on the printed circuit board. The plurality of second lands may be arranged substantially linearly so as to correspond to the plurality of second bumps arranged substantially linearly along the second side of the integrated circuit device when the integrated circuit device is mounted on the printed circuit board.

The at least one third land having an area larger than each one of the plurality of first lands is connected to the at least one third bump closer to ("close to" can be disposed in as noted previously) the row of the plurality of second lands than the row of the plurality of first lands. Thus, on a side of the row of the plurality of second lands, an entire area where bumps and the corresponding lands are bonded becomes widened, so that the bonding strength can be entirely increased. With this structure, an integrated circuit device having the number of second bumps less than the number of first bumps can be mounted and held on the printed circuit board with reliability.

In the printed circuit board described above, the at least one third land also may be disposed in the row formed by the plurality of second lands so as to correspond to the at least one third bump arranged in the row formed by the plurality of second bumps of the integrated circuit device when the integrated circuit device is mounted on the printed circuit board. In addition, a plurality of third lands may be arranged in the row formed by the plurality of second lands so as to correspond to a plurality of third bumps arranged in the row formed by the plurality of second bumps of the integrated circuit device when the integrated circuit device is mounted on the printed circuit board, and a sum of areas of the plurality of first lands is substantially the same as a sum of areas of the plurality of second lands and the plurality of third lands.

Accordingly, on the side of the row of the plurality of second lands, an entire area where bumps and the corresponding lands are bonded is widened, and external forces applied to the device are distributed evenly to the joints of the lands and bumps. Thereby, the connection strength can be entirely increased on the side of the plurality of second lands.

In relation to the printed circuit board, the at least one third bump may be a test bump used for a functional test of the integrated circuit device. Thus, a test bump which is previously included in the device is bonded to the third land as the third bump, allowing the test bump to increase the reliability in mounting the integrated circuit device on the printed circuit board.

The printed circuit board may further include an at least one fourth land disposed between a row formed by the plurality of first lands and the row formed by the plurality of second lands so as to correspond to an at least one fourth bump disposed between the row formed by the plurality of first bumps and the row formed by the plurality of second bumps. The at least one fourth land may be used for inputting or outputting the electrical signal with respect to the integrated circuit device via the at least one fourth bump when the integrated circuit device is mounted on the printed circuit board. In addition, a plurality of fourth lands may be arranged between the row formed by the plurality of first lands and the row formed by the plurality of second lands so as to correspond to a plurality of fourth bumps arranged between the row formed by the plurality of first bumps and the row formed by the plurality of second bumps of the integrated circuit device when the integrated circuit device is mounted on the printed circuit board.

With this structure, as the at least one fourth bump arranged between the row formed by the plurality of first lands and the row formed by the plurality of second lands is connected to the at least one fourth land, the sum of areas where the bumps and lands are connected becomes great, thereby helping to increase the overall connection strength.

The printed circuit board may further include a third wiring pattern that extends to connect the plurality of fourth lands to each other within an area covered by the integrated circuit device when the integrated circuit device is mounted on the printed circuit board. With this structure, an electrical resistance of each fourth land connected to the third wiring pattern can be reduced. In addition, by grounding the third wiring pattern, electronic noise can be reduced.

In the printed circuit board, the third wiring pattern may extend so as to pass at least one of a position corresponding to a third side of the integrated circuit device and a position corresponding to a fourth side of the integrated circuit device beyond the area covered by the integrated circuit device. The third wiring pattern may extend parallel to the row formed by the plurality of first lands and the row formed by the plurality of second lands in the area covered by the integrated circuit device. The third wiring pattern may supply a ground potential to the integrated circuit device via the plurality of fourth bumps when the integrated circuit device is mounted on the printed circuit board. With this structure, when the third wiring pattern is grounded, electronic noise in the first or second wiring pattern can be reduced.

The printed circuit board may further include a fifth land and a fourth wiring pattern. The fifth land may be disposed between the row formed by the plurality of first lands and the row formed by the plurality of second lands to correspond to a fifth bump disposed between the row formed by the plurality of first bumps and the row formed by the plurality of second bumps in the integrated circuit device when the integrated circuit device is mounted on the printed circuit board. The fourth wiring pattern may extend to be connected to the fifth land in the area covered by the integrated circuit device when the integrated circuit device is mounted on the printed circuit board. The fourth wiring pattern may supply power to the integrated circuit device via the fifth bump when the integrated circuit device is mounted on the printed circuit board, and the third wiring pattern and the fourth wiring pattern may be disposed adjacent and parallel to each other in the area covered by the integrated circuit device. With this structure, the third wiring pattern serves as a shield of the fourth wiring pattern, thereby reducing the power noise.

If the integrated circuit device is mounted on the printed circuit board, the plurality of first lands are connected to the plurality of first bumps of the integrated circuit device, the plurality of second lands are connected to the plurality of second bumps of the integrated circuit device, and the at least one third land is connected to the at least one third bump of the integrated circuit device. Such a printed circuit board may be used in an inkjet head. The inkjet head may further include a passage unit having a plurality of passages each passing a pressure chamber and extending to a nozzle; and an actuator unit fixed to the passage unit, the actuator unit changing a volume of the pressure chamber. The printed circuit board is capable of applying an electrical signal to change the volume of the pressure chamber to the actuator unit via the integrated circuit device. In this case, the first wiring pattern is connected to the actuator unit.

With this structure, an inkjet head can be provided with high reliability even if the number of nozzles becomes great, and the number of second bumps is less than the number of first bumps.

BRIEF DESCRIPTION OF THE DRAWINGS

An embodiment of the invention will be described in detail with reference to the following figures wherein:

FIG. 8 is a perspective view of the driver IC according to the first exemplary embodiment; and FIG. 9 is a perspective view of the driver IC according to the second exemplary embodiment.

DETAILED DESCRIPTION OF EMBODIMENTS

Figure 1:
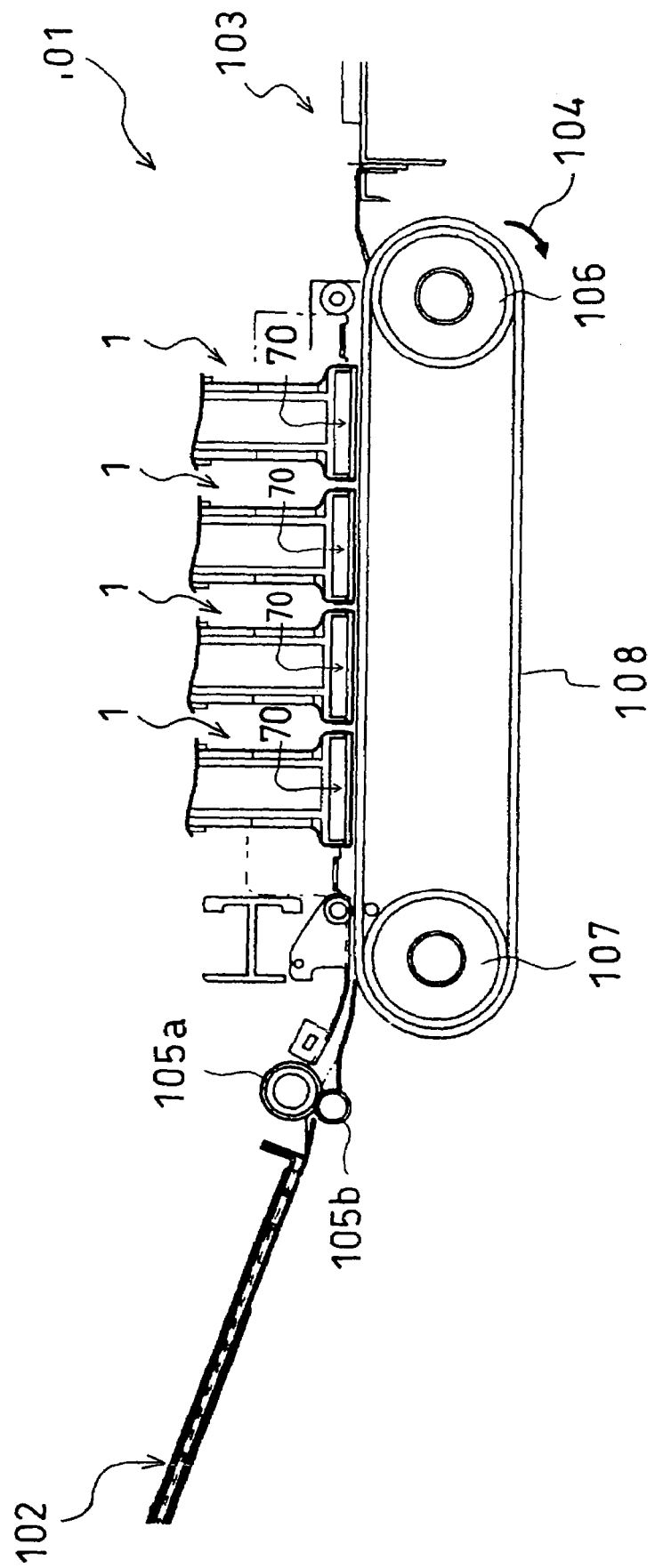
FIG. 1 is a diagrammatic view of an inkjet printer including a printed circuit board according to a first exemplary embodiment.

An inkjet printer 101 shown in FIG. 1 is a color inkjet printer including four inkjet heads 1. The inkjet printer 101 is provided with a sheet feed portion 102 on the left side of the drawing and a sheet ejection portion 103 on the right side.

Formed, inside of the inkjet printer 101, is a sheet feed path where a sheet of paper is fed from the sheet feed portion 102 to the sheet ejection portion 103. A pair of sheet feed rollers 105a, 105b are disposed downstream directly from the sheet feed portion 102. The sheet feed rollers 105a, 105b pick up a sheet of paper therebetween and feed it in from left to right in FIG. 1. In the middle of the sheet feed path, two belt rollers 106, 107, a conveyor belt 108 looped around the belt rollers 106, 107, and a motor (not shown), that drives the belt rollers 106, 107, are disposed. An outer surface of the conveyor belt 108, that is a carrying surface, is coated with silicone. A sheet conveyed by the sheet feed rollers 105a, 105b is held by the carrying surface of the conveyor belt 108 with its adhesion and conveyed toward the downstream side (rightward) by the belt roller 106 rotating in a clockwise direction (in a direction of an arrow 104).

Each of the four inkjet heads 1 includes, at a lower end thereof, a head body 70 having a rectangular plane. The inkjet heads 1 are arranged adjacent to each other such that a longitudinal direction of the head body 70 (a main scanning direction; a direction vertical to a sheet of FIG. 1) is perpendicular to a sheet feed direction. In other words, the inkjet heads 1 are line heads. A bottom surface of each head body 70 faces to the sheet feed path, and is formed as an ejection surface with a plurality of nozzles having a minute diameter. The inkjet heads 1 eject cyan, magenta, yellow and black inks from the corresponding head bodies 70. Inks of each color are ejected from the nozzles onto an upper surface, or a printed surface, of the sheet being conveyed, and thus a desired color image is formed on the sheet.

Figure 2:
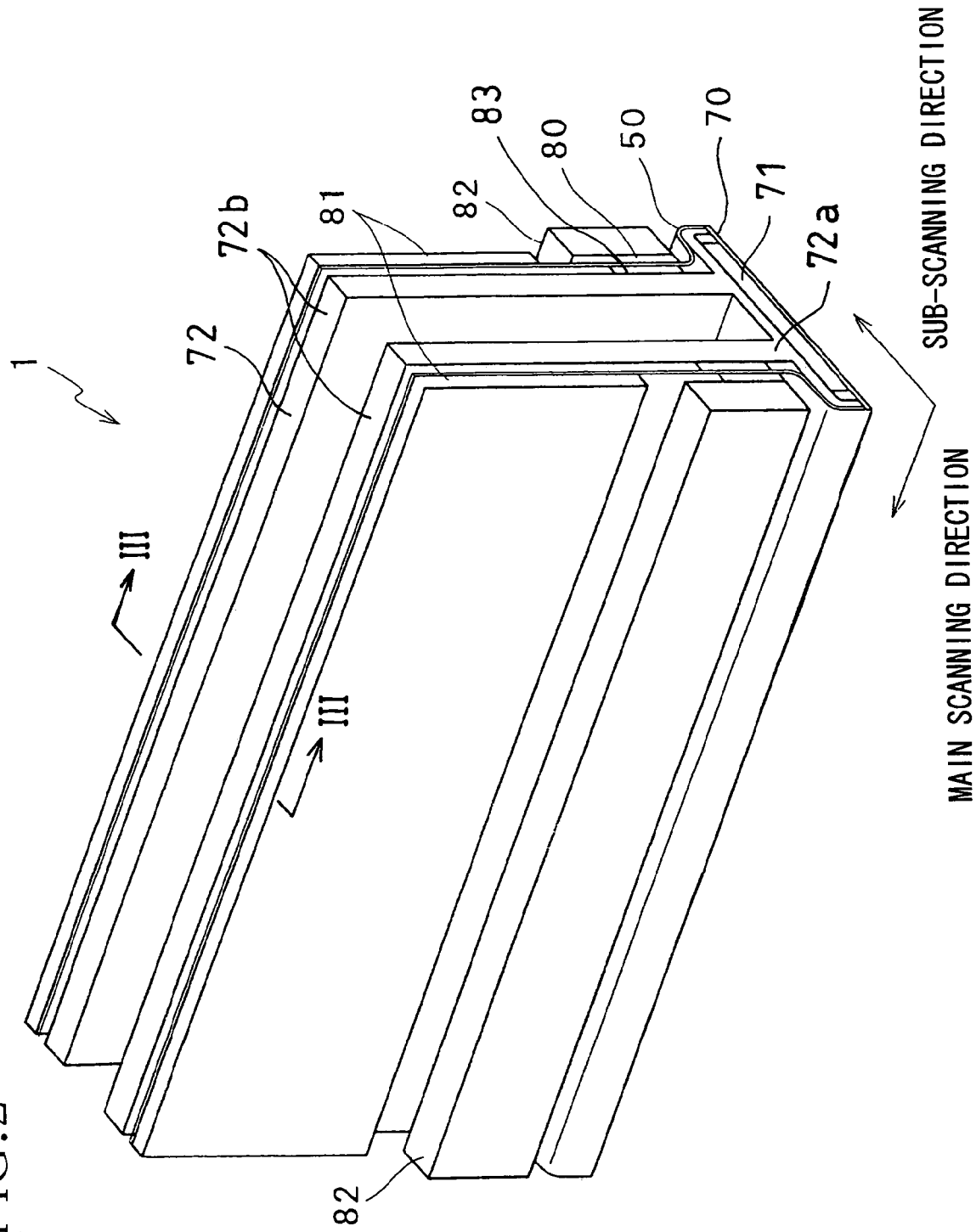
FIG. 2 is a perspective view of an inkjet head shown in FIG. 1.
Figure 3:
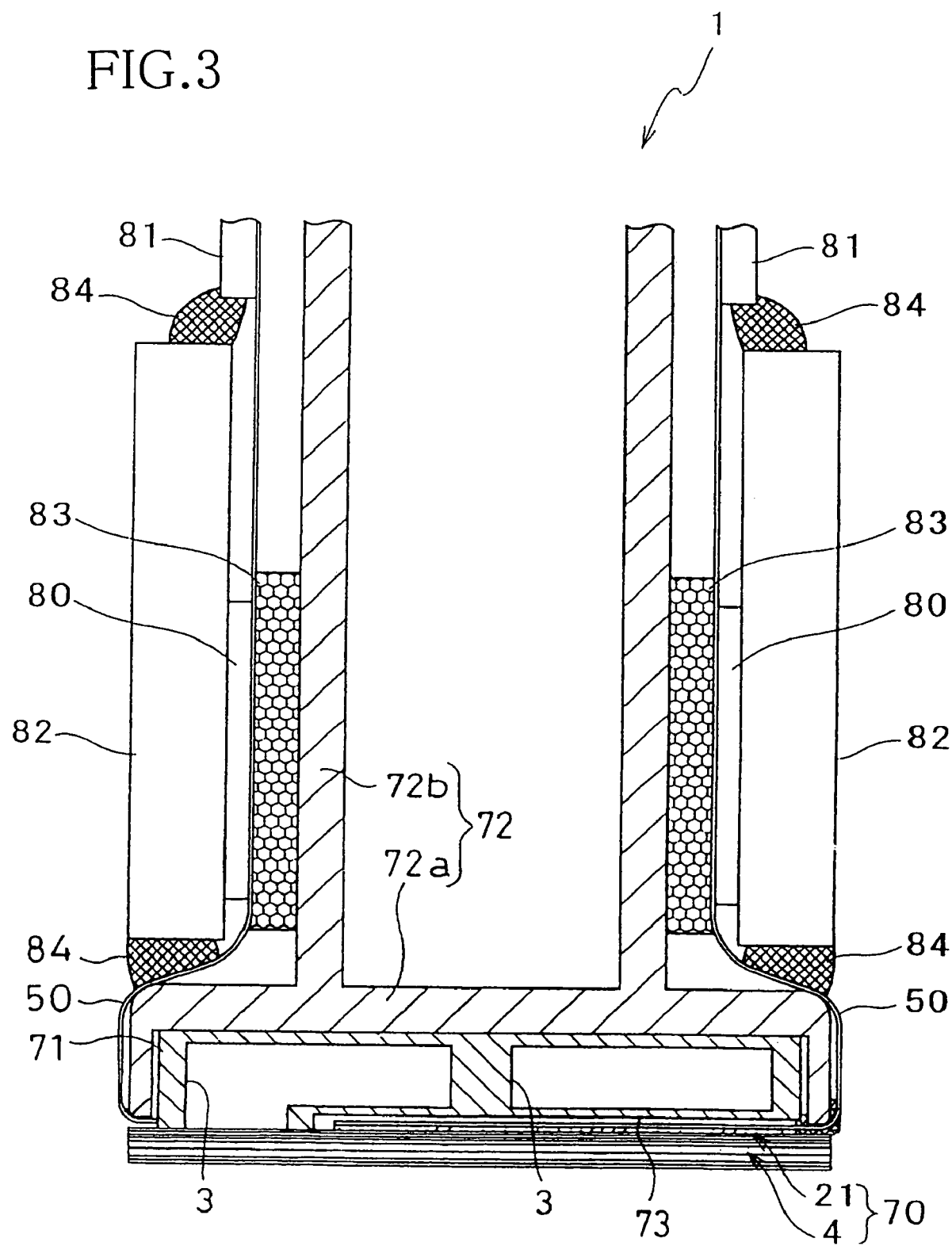
FIG. 3 is a sectional view of the inkjet head taken along the line III-III of FIG. 2.

The inkjet heads 1 will be described with reference to FIGS. 2 and 3. As each inkjet head 1 is identical in shape, structure and operation except for containing a different color of ink, the following description will be made with respect to one inkjet head 1. The inkjet head 1 includes the head body 70 having a rectangular plane, which extends in the main scanning direction to eject ink onto a sheet, and a base block 71, which is disposed over the head body 70 and formed with two ink reservoirs 3 providing ink passages through which ink is supplied to the head body 70.

The head body 70 includes a passage unit 4 and actuator units 21. The passage unit 4 is provided with a plurality of ink passages, each communicated to a corresponding one of the nozzles. The actuator units 21 are bonded over the passage unit 4 in a face-to-face relationship. The ink reservoirs 3 in the base block 71 are communicated to the passage unit 4 at an opening of a lower surface 73, such that ink is supplied from the ink reservoirs 3 to the ink passages formed in the passage unit 4. The ink passages individually include pressure chambers where pressure is generated to eject ink from the nozzles.

The actuator unit 21 is used to generate pressure in each pressure chamber of the ink passages, and structured so as to hold a piezoelectric sheet with a common electrode that maintains ground potential and a plurality of individual electrodes, each disposed to be opposed to one of the pressure chambers. The piezoelectric sheet is made of a ceramic material of lead zirconate titanate (PZT) having ferroelectricity. When a voltage is applied to the individual electrodes with a predetermined pattern, the piezoelectric sheet operates as an active layer at a part corresponding to each of the individual electrodes, and a part corresponding to each of the individual electrodes on the actuator unit 21 applies pressure to walls of a pressure chamber opposed to each of the individual electrodes. Thus, pressure is generated in each pressure chamber, causing ink stored in the pressure chambers to be ejected from the corresponding nozzles.

The base block 71 is adhesively fixed in a hollow formed at a lower surface of a base portion 72a of a holder 72. The holder 72 is provided with the base portion 72a and a pair of projecting portions 72b, which extend from the base portion 72a in an orthogonal direction thereto at a predetermined distance away from each other. At an upper surface of each actuator unit 21, each of flexible printed circuits, FPCs, 50 is connected to the individual electrodes and extends to a respective one side of the inkjet head 1. The FPCs 50 are thin printed circuit boards functioning as a power feed member. The FPCs 50, bonded to the actuator units 21, are placed, via elastic members 83, such as sponge, over and along the projecting portions 72b of the holder 72. On the FPCs 50 placed over the projecting portions 72b, are mounted driver ICs 80, which drive the actuator units 21. Heat sinks 82 are disposed on the outer surfaces of the driver ICs 80. Boards 81 are disposed above the corresponding driver ICs 80 and heat sinks 82. Each board 81 is connected to a corresponding FPC 50. The top surface of the heat sink 82 and the board 81, and the bottom surface of the heat sink 82 and the FPC 50 are bonded with sealing members 84 respectively.

The boards 81 are control circuit boards that control the actuator units 21 according to directions from a controller (not shown) to form a desired image on a recording medium. Conductive patterns formed on the boards 81 are electrically connected to the driver ICs 80 via the FPCs 50. Control signals are outputted from the boards 81 to the driver ICs 80, thereby controlling the actuator units 21. The driver ICs 80 are bare chips for driving the actuator unit 21 of the inkjet head 1 based on the control signals from the boards 81. The driver ICs 80, electrically connected to the actuator units 21 via the FPCs 50, convert the control signals from the boards 81 into drive signals, and output the drive signals to the actuator units 21.

Figure 4:
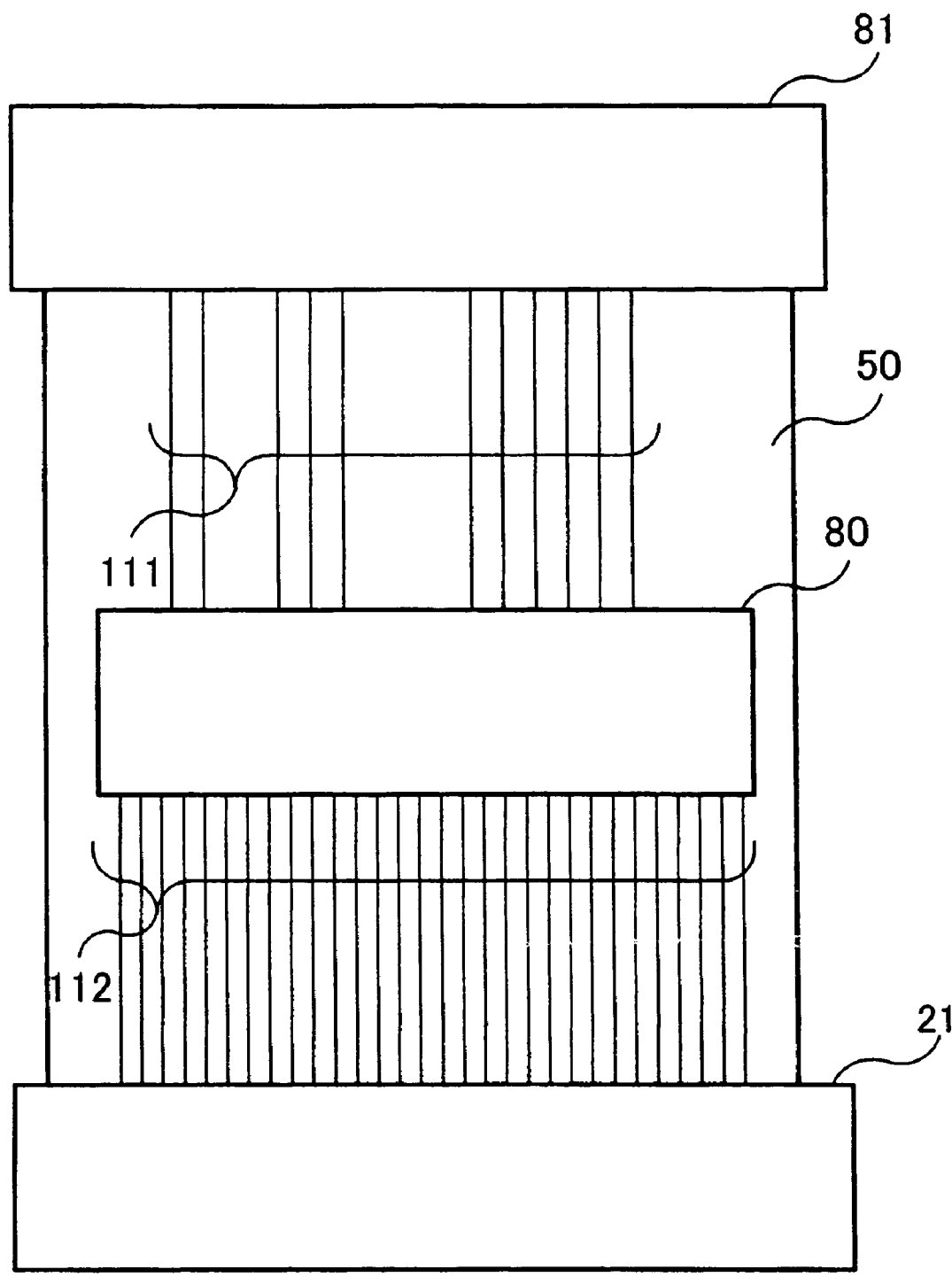
FIG. 4 is a developed view of a FPC shown in FIG. 3.
Figure 5:
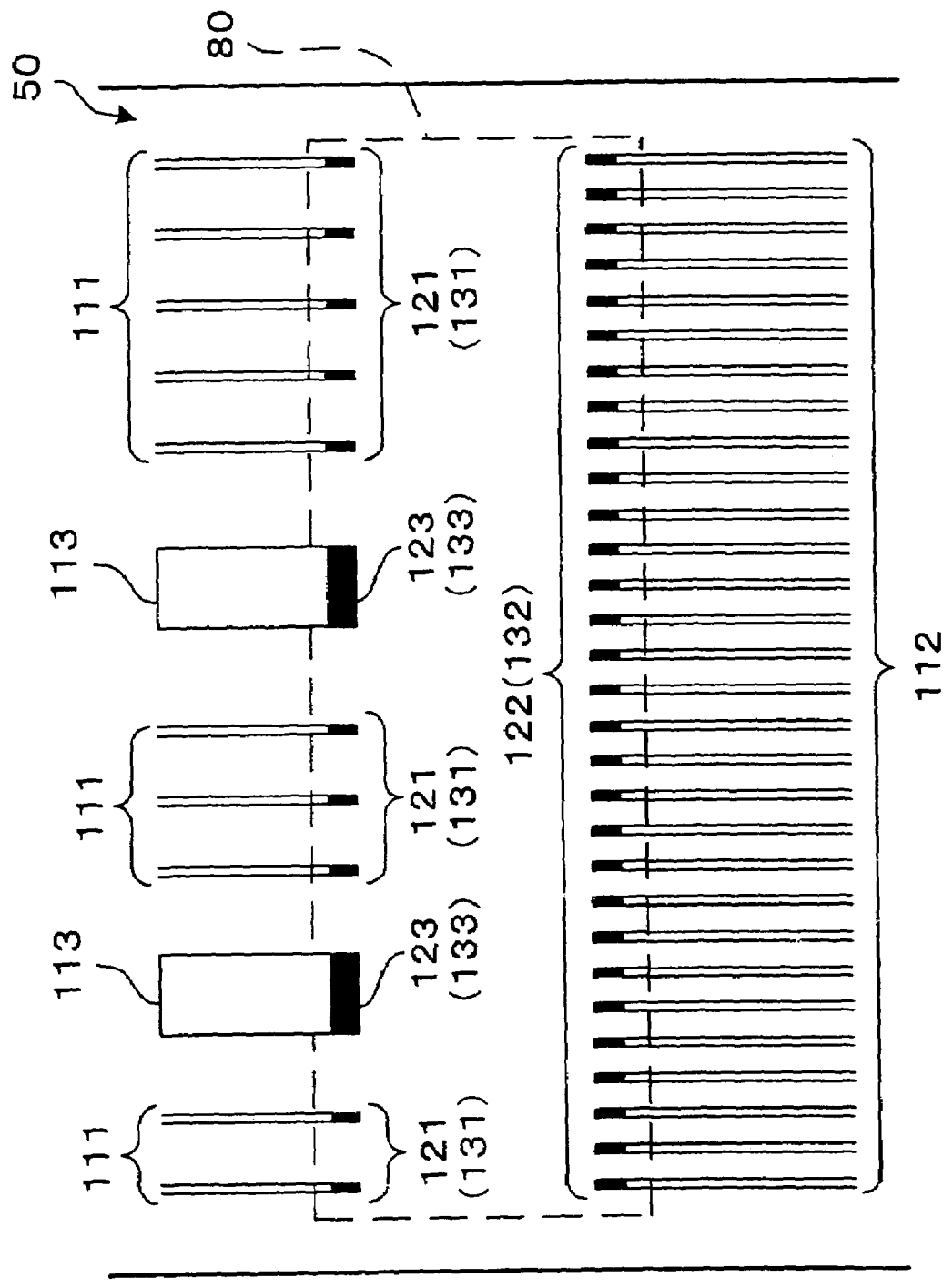
FIG. 5 is an enlarged view showing that a driver IC is mounted in the FPC shown in FIG. 4.

The driver IC 80 and the FPC 50 will be described in detail with reference to FIGS. 4 and 5. FIG. 4 shows a developed appearance of one FPC 50. In FIG. 5, the driver IC 80 is represented by a broken line for convenience of description, and numerals in parentheses represent portions provided in the driver IC 80. FIG. 5 is an enlarged view of an area where the driver IC 80 is mounted on the FPC 50.

The driver IC 80 has a rectangular shape, and includes a plurality of bumps 131, which are input electrodes and arranged along a side of the driver IC 80 closer to the board 81; a plurality of bumps 132, which are output electrodes and arranged along a side of the driver IC 80 closer to the actuator unit 21; and a plurality of bumps 133, which are test electrodes and arranged along the side of the driver IC 80 closer to the board 81 and used for operational testing of the driver IC 80 during manufacturing. As shown in FIG. 8, the bumps 131 through 133 are projecting electrodes formed with gold disposed on a surface of the driver IC 80 facing the FPC 50.

In the area where the driver IC 80 is mounted, the FPC 50 includes a plurality of lands 121 bonded to the bumps 131; a plurality of lands 122 bonded to the bumps 132; and a plurality of lands 123 bonded to the bumps 133. The lands 121 through 123 are given displacement plating with tin on a copper wiring pattern.

The FPC 50 includes a wiring pattern 111 of which traces are bonded to the lands 121 for inputting the control signals, which are outputted from the board 81, in order to control the actuator unit 21, into the bumps 131; a wiring pattern 112 of traces that are bonded to the lands 122 for entering the drive signals, which are outputted from the driver IC 80, to drive the actuator unit 21, into the individual electrodes of the actuator unit 21; and a wiring pattern 113 of traces is bonded to the lands 123 and does not input and output any signals to the bumps 133.

The board 81 serially outputs about 3.3V control signals, generated to control the actuator unit 21, to the driver IC 80 via the wiring pattern 111, the lands 121, and the bumps 131, in this order. The driver IC 80 converts the control signals serially inputted from the board 81 into about 30V drive signals, and outputs the 30V drive signals to each of the individual electrodes (not shown) of the actuator unit 21 in parallel via the bumps 132, the lands 122, and the wiring pattern 112 in this order. Thus, in the driver IC 80, the number of bumps 131 is less than that of bumps 132, and the number of traces of the wiring pattern 111 is thus less than the traces of the wiring pattern 112.

The bumps 133 or test bumps have a certain degree of area, as they need contact with a probe when operation test of the driver IC 80 is performed. Thus, the area of the bump 133 is larger than that of the bumps 131, 132. Accordingly, the area of the land 123 is also larger than that of the lands 121, 122. The sum of the areas of the bumps 131, 133 arranged along the same side of the driver IC 80 is substantially the same as the sum of the areas of the bumps 132 arranged along the opposite side thereof. In addition, the sum of the areas of the lands 121, 123 arranged such as to face to the bumps 131, 133 is substantially the same as the sum of the areas of the lands 122 arranged facing the bumps 132.

In the manufacturing process of the inkjet head 1, when the driver IC 80 is mounted on the FPC 50, the driver IC 80 is placed on the FPC 50 so that the bumps 131 to 133 face the lands 121 to 123, and fixed by heat at a predetermined temperature. Thereby, the gold on the bumps 131 to 133 is alloyed with tin on the lands 121 to 123, so that the bumps 131 to 133 are bonded to the lands 121 to 123.

According to the first embodiment described above, even when the number of bumps 131 arranged on the input side is less than the number of bumps 132 arranged on the output side as in the driver IC 80, the FPC 50 is provided with the lands 123 to be bonded to the bumps 133, so that the sum of the areas of the bumps 131, 133 arranged on the same side is substantially the same as that of the bumps 132 arranged on the opposite side, and the sum of the areas of the lands 121, 123 arranged on the same side is substantially the same as that of the lands 122 arranged on the opposite side. With this structure, the entire area where bumps and lands are bonded becomes wide, and the reliability of mounting the driver IC 80 onto the FPC 50 can be increased. In addition, this structure distributes pressure generated when mounting evenly to each of the lands 121, 122, so that highly reliable mounting can be performed.

Only by forming the lands 123, which are to be bonded to the test bumps provided to the driver IC 80, on the FPC 50, the area where the bumps and the lands are bonded on the input side can be widened. Thus, the reliability of mounting the driver IC 80 onto the FPC 50 can be increased without extra cost.

A second exemplary embodiment will now be described. It is noted that for the elements, except for the FPC 50 and the driver IC 80, that are similar to or identical with those in the first exemplary embodiment and designated by similar numerals, the description thereof can be omitted for the sake of brevity.

Figure 6:
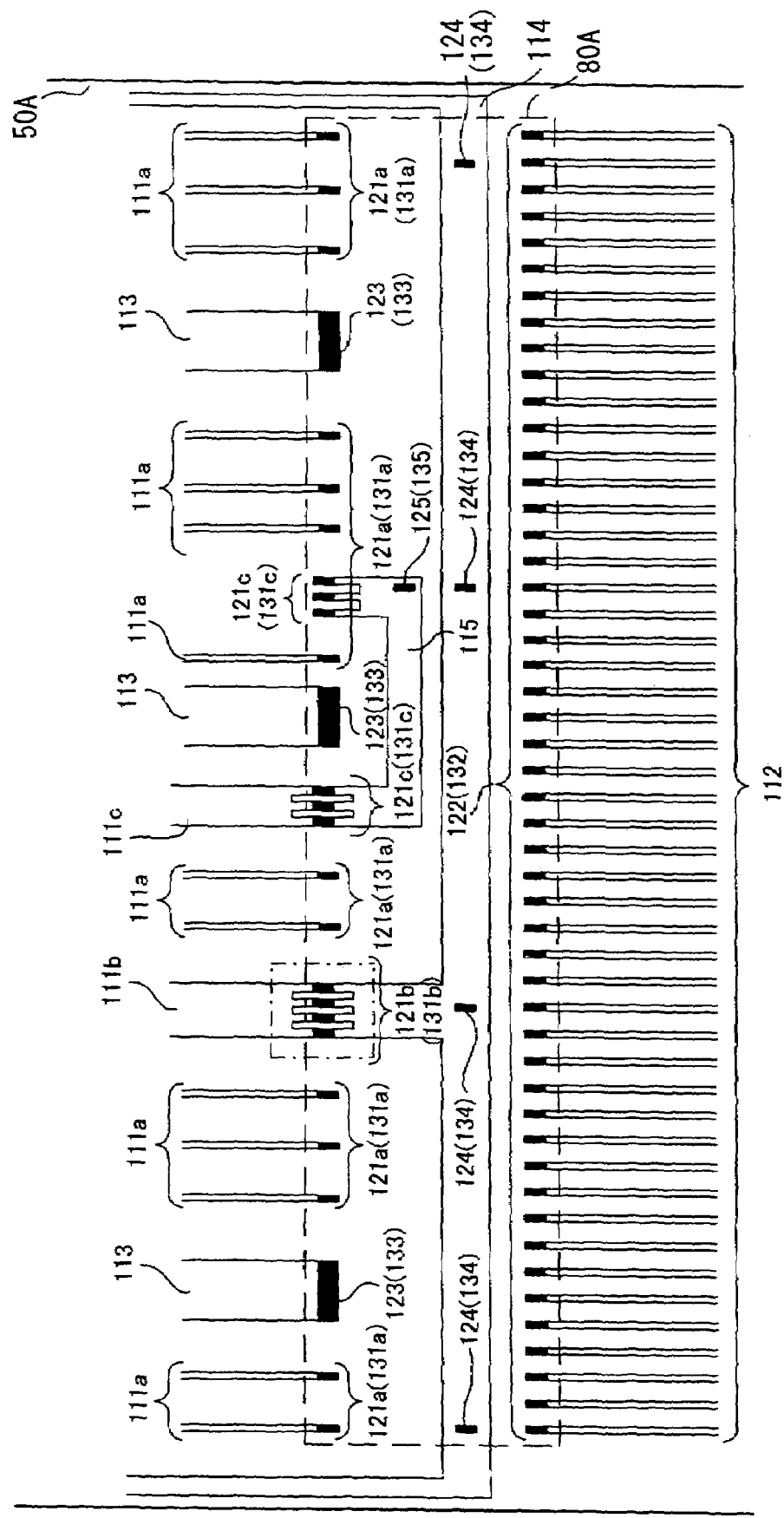
FIG. 6 is an enlarged view showing that a driver IC is mounted in a FPC according to a second exemplary embodiment.
Figure 7:
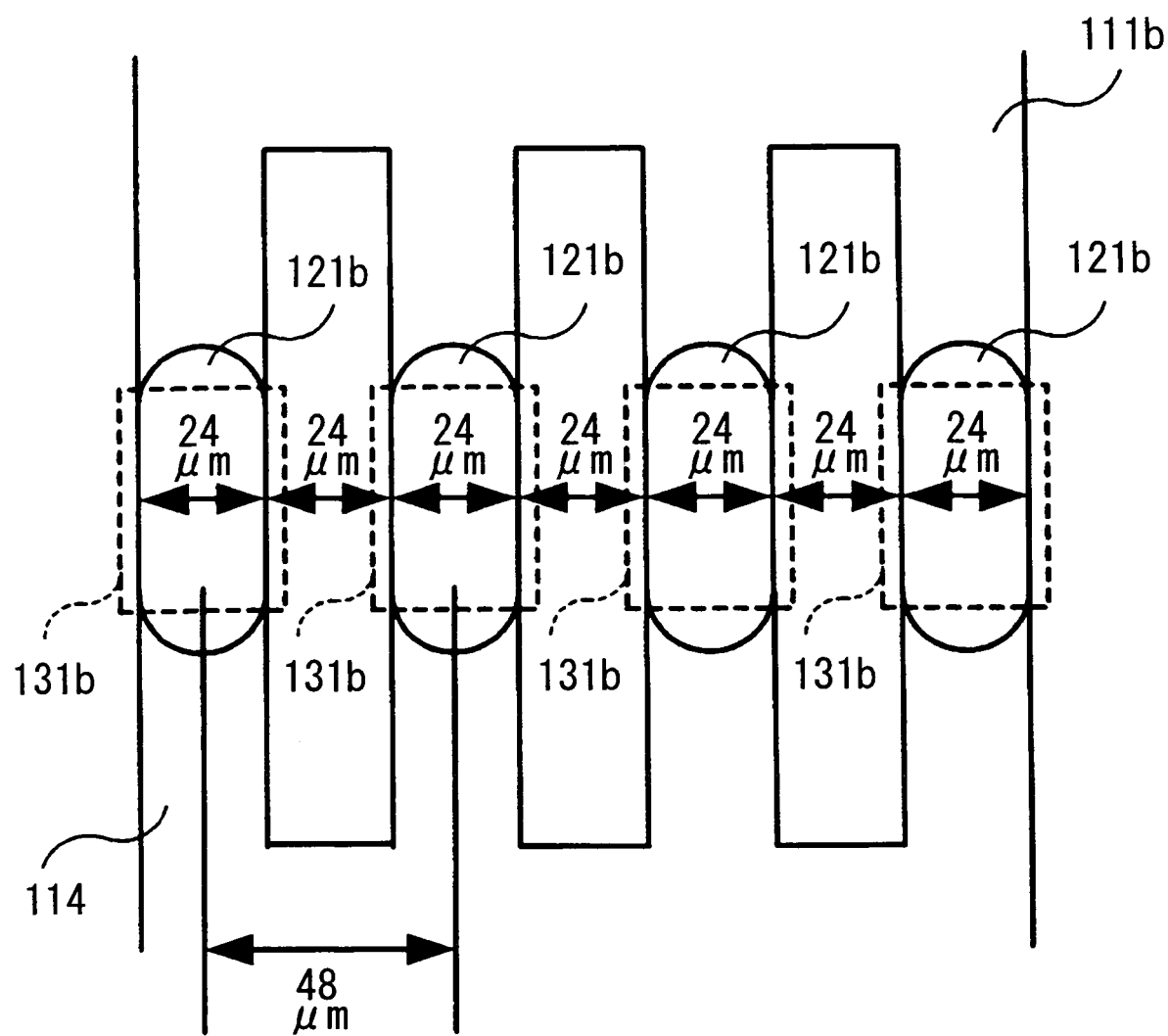
FIG. 7 is an enlarged view of an area indicated with a dash dot line shown in FIG. 6.

FIG. 6 is an enlarged view of an area where a driver IC 80A is mounted on a FPC 50A. For convenience of description, the driver IC 80A is represented by a broken line and numerals in parentheses represent portions provided in the driver IC 80A. FIG. 7 is an enlarged view of an area indicated with a dash dot line shown in FIG. 6.

The driver IC 80A has a rectangular shape, and includes a plurality of bumps 131a, 131b, 131c, and 133, which are arranged along a side of the driver IC 80A closer to the board 81. The bumps 131a are electrodes to which control signals are inputted. The bumps 131b are ground electrodes, the bumps 131c are power electrodes, and the bumps 133 are test electrodes used for operational testing of the driver IC 80A during manufacturing. The driver IC 80A also includes a plurality of bumps 132, 134, 135. The bumps 132 are arranged along a side of the driver IC 80A closer to the actuator unit 21. The bumps 132 are electrodes outputting drive signals. The bumps 134 are ground electrodes arranged so as to be parallel with and between the row of the bumps 131a, 131b, and 131c and the row of the bumps 132. The bump 135 is a power electrode arranged between the row of the bumps 131a, 131b, and 131c and the row of the bumps 134. As shown in FIG. 9, the bumps 131a through 131c, 133, and 132 through 135 are projecting electrodes formed with gold disposed on a bottom surface of the driver IC 80A.

In the area where the driver IC 80A is mounted, the FPC 50A includes a plurality of lands 121a through 121c bonded to the bumps 131a through 131b; a plurality of lands 122 bonded to the bumps 132; a plurality of lands 123 bonded to the bumps 133; a plurality of lands 124 bonded to the bumps 134; and a land 125 bonded to the bump 135. The lands 121a through 121c and 122 through 125 are given displacement plating with tin on a copper wiring pattern.

The FPC 50A includes a wiring pattern 111a which is connected to the lands 121a for inputting the control signals, which are outputted from the board 81, in order to control the actuator units 21, into the bumps 131a; a wiring pattern 111b which is connected to the lands 121b for entering a ground potential common to the board 81, into the bumps 131b; a wiring pattern 111c, which is connected to the lands 121c for entering power into the bumps 131c; a wiring pattern 112, which is connected to the lands 122 for entering drive signals, which are outputted from the driver IC 80A, to drive the actuator units 21, into the individual electrodes of each actuator unit 21; a wiring pattern 113, which is connected to the lands 123 and does not input and output any signals to the bumps 133; a ground pattern 114, which is connected to the lands 121b and the lands 124 for supplying a ground potential common to the board 81 to the bumps 131b, 134; and a power pattern 115, which is connected to the lands 121c, 125 for supplying power to the bumps 131c, 135.

Each wiring pattern 111b, 111c extends to the corresponding lands 121b, 121c. Each wiring pattern 111b, 111c is separated into traces, forming a comb-like shape at its end near the lands 121b, 121c and outside the area where the driver IC 80A is disposed, and is connected to the corresponding lands 121b, 121c. This structure facilitates moving underfill material, which is a thermosetting resin to fix the driver IC 80A, into between the lands 121b, 121c.

As shown in FIG. 7, the bump 131b has a width greater than that of the land 121b. The land 121b has a width of 24 μm, and a pitch of the lands 121b and the bumps 131b is 48 μm. By making the pitch double the width of the land 121b, it can save space in the width direction and increase tolerances for positional deviations at mounting.

The board 81 serially outputs about 3.3V control signals, generated to control the actuator unit 21, to the driver IC 80A via the wiring pattern 111a, the lands 121a, and the bumps 121b in this order. The driver IC 80A converts the control signals serially inputted from the board 81 into about 30V drive signals, and outputs the 30V drive signals to each of the individual electrodes (not shown) of the actuator unit 21 in parallel via the bumps 132, the lands 122, and the wiring patterns 112 in order. Thus, in the driver IC 80A, the number of bumps 131a is less than that of bumps 132, and the number of traces of the wiring pattern 111a is thus less than that of the wiring pattern 112.

The bumps 133 or test bumps have a certain degree of area, as they need contact with a probe when operation test of the driver IC 80A is performed. Thus, the area of the bumps 133 is larger than that of the bumps 131a, 132. Accordingly, the area of the lands 123 is also larger than that of the lands 121a, 122. The sum of the areas of the bumps 131a through 131c, 133 arranged along the same side of the driver IC 80A is substantially the same as the sum of the areas of the bumps 132 arranged along the opposite side thereof. In addition, the sum of the areas of the lands 121a through 121c, and 123 arranged so as to be bonded along the same side as the bumps 131a through 131c, 133 are arranged is substantially the same as the sum of the areas of the lands 122 arranged along the opposite side thereof.

The ground pattern 114 is disposed so as to be parallel with a row of the lands 121a through 121c, 123 and a row of the lands 122 therebetween within an area where the driver IC 80A is placed. In addition, the ground pattern 114 extends linearly so as to pass the driver IC 80A in a direction perpendicular to two sides except for the side close to the board 81 and the side close to the actuator unit 21. The ground pattern 114 bends at right angles outside the area where the driver IC 80A is placed, and extends toward the board 81. The ground pattern 114 is connected to the lands 121b in the area where the driver IC 80A is placed. The power pattern 115 is disposed such as to be partially parallel between a row of the lands 121a through 121c, 123 and the ground pattern 114 within the area where the driver IC 80A is placed. In addition, the power pattern 115 is connected to the lands 121c within the area where the driver IC 80A is disposed.

According to the second embodiment, the lands 124, 125, which are disposed between the row of the lands 121a through 121c, 123 and the row of the lands 122, are bonded to the bumps 134, 135. Thus, the sum of the areas where the bumps and the lands are bonded is increased, thereby improving the entire strength to mount the driver IC onto the FPC, in addition to the effects of the first embodiment.

The ground pattern 114 and the power pattern 115 are connected to not only the lands 124, 125 but also the lands 121b, 121c, so that electrical resistances of the ground and the power supply source can be reduced.

Further, the ground pattern 114 is placed so as to pass between the row of the lands 121a through 121c, 123 and the row of the lands 122 and cross over where the driver IC 80A is mounted. Thus, noise can be reduced in the wiring patterns 111a and 112.

In addition, the power pattern 115 is disposed so as to be partially adjacent to and parallel with the ground pattern 114, so that the ground pattern 114 functions as a shield of the power pattern 115 and power noise can be reduced.

The relationship between the power pattern 115 and the ground pattern 114 becomes equal to that they are connected to a capacitor, so that impedance of the power line can be reduced.

Although the invention has been described with reference to exemplary embodiments, the description of the exemplary embodiments is illustrative only and is not to be construed as limiting the scope. Various other modifications and changes may occur to those skilled in the art without departing from the spirit and scope of the description. For example, in the first embodiment, the FPC 50 is structured to function as a power feed member in the inkjet head 1, however, it is not limited to such a structure. The FPC 50 may be an electrical circuit functioning as a member other than the power feed member.

In the first embodiment, the FPC 50 is a thin printed circuit board and is made by employing technology called chip on film (COF) where bare chips are mounted on a polyimide film circuit board. However, it may be replaced with any kind of printed circuit board other than the FPC.

In addition, in the first embodiment, the lands 123 are arranged in alignment with the lands 121 along the side of the driver IC 80 closer to the board 81, however, the lands 123 and the lands 121 may be arranged parallel to each other or both or one of the lands 123 and the lands 121 may be arranged in a staggered configuration.

In the first embodiment, the driver IC 80, in which the control signals are inputted from the bumps 131 and the drive signals are outputted from the bumps 132, is mounted on the FPC 50. However, the invention is not limited to this structure. An element to be mounted may be structured so that any electrical signals can be inputted or outputted from all bumps arranged on all sides of the element.

In the first embodiment, the test bumps 133 of the driver IC 80 are bonded to the lands 123. However, the embodiment is not limited to this structure. The FPC may be provided with lands to be bonded to bumps other than the test bumps, such that the sum of the area of the bumps arranged along a side of the driver IC may be substantially the same as that of the bumps arranged along the opposite side thereof, and the sum of areas of lands arranged such as to be bonded along the side may be substantially the same as that of lands arranged along the opposite side.

In the first embodiment, that the wiring pattern 113 is connected to the lands 123. However, the wiring pattern 113 may be omitted.

In the second embodiment, the ground pattern 114 is placed such as to pass between the row of the lands 121a through 121c, 123 and the row of the lands 122 and to cross over the driver IC 80A when mounted. However, the embodiment is not limited to this structure. The ground pattern 114 may be disposed universally. The ground pattern 114 and the power pattern 115 may be omitted.

In addition, in the second embodiment, a part of the power pattern 115 is disposed adjacent to and parallel to the ground pattern 114. However, the power pattern and the ground pattern may not be disposed adjacent to or parallel to each other.

What is claimed is:

1. A printed circuit board, comprising:
   a plurality of first lands arranged to correspond to a plurality of first bumps on an integrated circuit device having a first side and a second side facing each other when the integrated circuit device is mounted on the printed circuit board, the plurality of first bumps being arranged along the first side of the integrated circuit device, the plurality of first lands being used for individually inputting or outputting an electrical signal with respect to the integrated circuit device via the plurality of first bumps when the integrated circuit device is mounted on the printed circuit board;

a first wiring pattern connected to the plurality of first lands;

a plurality of second lands arranged to correspond to a plurality of second bumps arranged along the second side of the integrated circuit device when the integrated circuit device is mounted on the printed circuit board, the plurality of second lands being less than the plurality of first lands in number, the plurality of second lands being used for individually inputting or outputting the electrical signal with respect to the integrated circuit device via the plurality of second bumps when the integrated circuit device is mounted on the printed circuit board;

a second wiring pattern connected to the plurality of second lands; and an at least one third land disposed to correspond to an at least one third bump on the integrated circuit device when the integrated circuit device is mounted on the printed circuit board, the at least one third bump being disposed one of in a row formed by the plurality of second bumps and closer to the row formed by the plurality of second bumps than a row formed by the plurality of first bumps on the integrated circuit device, the at least one third land having an area larger than each one of the plurality of first lands, the at least one third land not being used for inputting and outputting the electrical signal with respect to the integrated circuit device via the at least one third bump when the integrated circuit device is mounted on the printed circuit board.

2. The printed circuit board according to claim 1, wherein the integrated circuit device is a rectangle.

3. The printed circuit board according to claim 2, wherein the plurality of first lands are arranged substantially linearly so as to correspond to the plurality of first bumps arranged substantially linearly along the first side of the integrated circuit device when the integrated circuit device is mounted on the printed circuit board, and the plurality of second lands are arranged substantially linearly so as to correspond to the plurality of second bumps arranged substantially linearly along the second side of the integrated circuit device when the integrated circuit device is mounted on the printed circuit board.

4. The printed circuit board according to claim 2, wherein the at least one third land is disposed in a row formed by the plurality of second lands so as to correspond to the at least one third bump arranged in the row formed by the plurality of second bumps of the integrated circuit device when the integrated circuit device is mounted on the printed circuit board.

5. The printed circuit board according to claim 4, wherein the at least one third land comprises a plurality of third lands arranged in the row formed by the plurality of second lands so as to correspond to the at least one third bump which comprises a plurality of third bumps arranged in the row formed by the plurality of second bumps of the integrated circuit device when the integrated circuit device is mounted on the printed circuit board, and a sum of areas of the plurality of first lands is substantially the same as a sum of areas of the plurality of second lands and the third lands.

6. The printed circuit board according to claim 2, wherein the at least one third bump is a test bump used for a functional test of the integrated circuit device.

7. The printed circuit board according to claim 2, further comprising an at least one fourth land disposed between a row formed by the plurality of first lands and the row formed by the plurality of second lands so as to correspond to an at least one fourth bump disposed between the row formed by the plurality of first bumps and the row formed by the plurality of second bumps, the at least one fourth land being used for inputting or outputting an electrical signal with respect to the integrated circuit device via the at least one fourth bump when the integrated circuit device is mounted on the printed circuit board.

8. The printed circuit board according to claim 7, wherein the at least one fourth land comprises a plurality of fourth lands arranged between the row formed by the plurality of first lands and the row formed by the plurality of second lands so as to correspond to the at least one fourth bump which comprises a plurality of fourth bumps arranged between the row formed by the plurality of first bumps and the row formed by the plurality of second bumps of the integrated circuit device when the integrated circuit device is mounted on the printed circuit board.

9. The printed circuit board according to claim 8, further comprising a third wiring pattern that extends to connect the plurality of fourth lands to each other within an area covered by the integrated circuit device when the integrated circuit device is mounted on the printed circuit board.

10. The printed circuit board according to claim 9, wherein the third wiring pattern extends so as to pass at least one of a position corresponding to a third side of the integrated circuit device and a position corresponding to a fourth side of the integrated circuit device beyond the area covered by the integrated circuit device.

11. The printed circuit board according to claim 10, wherein the third wiring pattern extends parallel to the row formed by the plurality of first lands and the row formed by the plurality of second lands in the area covered by the integrated circuit device.

12. The printed circuit board according to claim 11, wherein the third wiring pattern supplies a ground potential to the integrated circuit device via the plurality of fourth bumps when the integrated circuit device is mounted on the printed circuit board.

13. The printed circuit board according to claim 12, further comprising:

a fifth land disposed between the row formed by the plurality of first lands and the row formed by the plurality of second lands to correspond to a fifth bump disposed between the row formed by the plurality of first bumps and the row formed by the plurality of second bumps in the integrated circuit device when the integrated circuit device is mounted on the printed circuit board; and a fourth wiring pattern that extends to be connected to the fifth land in the area covered by the integrated circuit device when the integrated circuit device is mounted on the printed circuit board, and wherein the fourth wiring pattern supplies power to the integrated circuit device via the fifth bump when the integrated circuit device is mounted on the printed circuit board, and the third wiring pattern and the fourth wiring pattern are disposed adjacent to and parallel to each other in the area covered by the integrated circuit device.

14. The printed circuit board according to claim 1, with the integrated circuit device mounted thereon, wherein the plurality of first lands are connected to the plurality of first bumps of the integrated circuit device, the plurality of second lands are connected to the plurality of second bumps of the integrated circuit device, and the at least one third land is connected to the at least one third bump of the integrated circuit device.

15. An inkjet head, comprising:

a passage unit having a plurality of passages each passing a pressure chamber and extending to a nozzle;

an actuator unit fixed to the passage unit, the actuator unit changing a volume of the pressure chamber; and a printed circuit board according to claim 14, the printed circuit board being capable of applying an electrical signal to change the volume of the pressure chamber to the actuator unit via the integrated circuit device, wherein the first wiring pattern is connected to the actuator unit.

16. A drive unit for an inkjet printhead, comprising:

a printed circuit board, the printed circuit board having a plurality of first lands; a plurality of second lands opposite of, but separated from, the plurality of first lands; and at least one third land, a number of first lands less than a number of second lands; and an IC driver mounted to the printed circuit board, the IC driver having a plurality of first bumps; a plurality of second bumps opposite of, but separated from, the plurality of first bumps; and at least one third bump, a number of first bumps less than a number of second bumps, wherein the plurality of first lands are attached to the plurality of first bumps, the plurality of second lands are attached to the plurality of second bumps, and the at least on third land is attached to the at least one third bump, the attached at least one third land and third bump closer to the attached plurality of first lands and bumps than to the attached plurality of second lands and bumps.

17. The drive unit according to claim 16, wherein the attached at least one third land and bump is within the attached plurality of first lands and bumps.

18. The drive circuit according to claim 16, wherein the IC driver is substantially rectangular and the plurality of first bumps are along one side and the plurality of second bumps are along an opposing second side.

19. The drive circuit according to claim 16, further comprising a fourth land extending between the plurality of first lands and the plurality of second lands on the printed circuit board; and at least one fourth bump on the IC board, the at least one fourth bump attached to the fourth land.

20. The drive circuit according to claim 16, wherein an area of attachment of the attached plurality of first lands and bumps and the attached at least one third land and bump is substantially equal to an area of attachment of the attached plurality of second lands and bumps.

* * * * *